United States Patent
Sun et al.

(10) Patent No.: US 12,159,680 B2
(45) Date of Patent: Dec. 3, 2024

(54) DATA WRITING METHOD, TEST METHOD, WRITING APPARATUS, MEDIUM, AND ELECTRONIC DEVICE

(71) Applicant: CHANGXIN MEMORY TECHNOLOGIES, INC., Hefei (CN)

(72) Inventors: Yuanyuan Sun, Hefei (CN); Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 143 days.

(21) Appl. No.: 18/154,924

(22) Filed: Jan. 16, 2023

(65) Prior Publication Data

US 2023/0342083 A1 Oct. 26, 2023

Related U.S. Application Data

(63) Continuation of application No. PCT/CN2022/099381, filed on Jun. 17, 2022.

(30) Foreign Application Priority Data

Apr. 24, 2022 (CN) .......................... 202210460071.4

(51) Int. Cl.
*G11C 29/10* (2006.01)
*G11C 29/18* (2006.01)

(52) U.S. Cl.
CPC .............. *G11C 29/10* (2013.01); *G11C 29/18* (2013.01)

(58) Field of Classification Search
CPC ...................................................... G11C 29/10
See application file for complete search history.

(56) References Cited

U.S. PATENT DOCUMENTS

| 5,959,911 A * | 9/1999 | Krause ................... G11C 29/28 365/201 |
| 7,170,797 B2 | 1/2007 | Haetty |
| 9,111,586 B2 | 8/2015 | Ou |
| 2004/0177296 A1* | 9/2004 | Saito ...................... G11C 29/36 714/724 |
| 2006/0171220 A1 | 8/2006 | Haetty |
| 2014/0036603 A1 | 2/2014 | Ou |

FOREIGN PATENT DOCUMENTS

| CN | 1825494 A | 8/2006 |
| CN | 103000228 A | 3/2013 |
| CN | 103514956 A | 1/2014 |

* cited by examiner

*Primary Examiner* — Joseph D Torres
(74) *Attorney, Agent, or Firm* — Syncoda LLC; Feng Ma (57) ABSTRACT

A data writing method includes: receiving a first writing command, and selecting a target bank and a target column address according to the first writing command, data corresponding to the first writing command being first test data; writing the first test data into the target column address of the bank selected according to the first writing command, and latching the first test data on an address bus during the writing at least until a second writing command is executed; receiving the second writing command, and reselecting the target bank and the target column address according to the second writing command; and writing the first test data latched on the address bus into a reselected target column address of a reselected target bank.

20 Claims, 5 Drawing Sheets

DATA WRITING METHOD, TEST METHOD, WRITING APPARATUS, MEDIUM, AND ELECTRONIC DEVICE

CROSS-REFERENCE TO RELATED APPLICATIONS

This application is a continuation of International Application No. PCT/CN2022/099381, filed on Jun. 17, 2022, which claims priority to Chinese Patent Application No. 202210460071.4, filed on Apr. 24, 2022. The disclosures of International Application No. PCT/CN2022/099381 and Chinese Patent Application No. 202210460071.4 are hereby incorporated by reference in their entireties.

BACKGROUND

A Dynamic Random Access Memory (DRAM) includes a plurality of memory cells for storing data. Each memory cell may include a transistor for gating the writing of data to the memory cell and the reading of data from the memory cell, and a capacitor for storing data in the form of charges.

Since the structure of the DRAM is too fine and the mass production process is complicated, in the capacitor process of the DRAM, capacitor pillars forming the capacitors are easily inclined to each other, so that a failure is likely to occur between adjacent capacitor units.

Therefore, it is desirable to write test data to memory cells in a memory array to determine whether the memory array has defective memory cells.

It is to be noted that the information disclosed in the Background is only for enhancement of understanding of the background of the present disclosure, and thus may include information that does not constitute the conventional art known to those of ordinary skill in the art.

SUMMARY

The present disclosure relates to the technical field of memories, and more particularly, to a data writing method for a memory array, a test method for a memory array, a data writing apparatus for a memory array, a computer-readable medium, and an electronic device.

An object of the present disclosure is to provide a data writing method for a memory array, a test method for a memory array, a data writing apparatus for a memory array, a computer-readable medium, and an electronic device, which can shorten the data writing time of a memory array and improve the data writing efficiency.

According to a first aspect of embodiments of the present disclosure, a data writing method for a memory array is provided. The data writing method may include the following operations. A first writing command is received, and a target bank and a target column address are selected according to the first writing command. Data corresponding to the first writing command is first test data. The first test data is written into the target column address of the bank selected according to the first writing command, and the first test data is latched on an address bus during the writing at least until a second writing command is executed. The second writing command is received, and the target bank and the target column address are reselected according to the second writing command. The first test data latched on the address bus is written into a reselected target column address of a reselected target bank.

According to a second aspect of embodiments of the present disclosure, a data writing apparatus for a memory array is provided. The data writing apparatus may include an addressing circuit and a data writing circuit. The addressing circuit is configured to receive a first writing command, and select a target bank and a target column address according to the first writing command, data corresponding to the first writing command being first test data. The data writing circuit is configured to write the first test data into the target column address of the bank selected according to the first writing command, and latch the first test data on an address bus during the writing at least until a second writing command is executed. The addressing circuit is further configured to receive the second writing command, and reselect the target bank and the target column address according to the second writing command. The data writing circuit is further configured to write the first test data latched on the address bus into a reselected target column address of a reselected target bank.

According to a third aspect of embodiments of the present disclosure, an electronic device is provided. The electronic device may include: one or more processors; and a memory configured to store computer-executable instructions that, when executed by the one or more processors, cause the one or more processors to implement operations of: receiving a first writing command, and selecting a target bank and a target column address according to the first writing command, data corresponding to the first writing command being first test data; writing the first test data into the target column address of the bank selected according to the first writing command, and latching the first test data on an address bus during the writing at least until a second writing command is executed; receiving the second writing command, and reselecting the target bank and the target column address according to the second writing command; and writing the first test data latched on the address bus into a reselected target column address of a reselected target bank.

It is to be understood that the above general description and the following detailed description are intended to be illustrative and not restrictive. The present disclosure cannot be limited.

BRIEF DESCRIPTION OF THE DRAWINGS

The accompanying drawings, which are incorporated in and constitute a part of this specification, illustrate embodiments consistent with the present disclosure and, together with the specification, serve to explain the principle of the present disclosure. It is apparent that the drawings in the following description are only some embodiments of the present disclosure, and other drawings can be obtained from those skilled in the art according to these drawings without any creative work.

DETAILED DESCRIPTION

Example embodiments will now be described more fully with reference to the accompanying drawings. However, the example embodiments can be embodied in a variety of forms and should not be construed as being limited to the examples set forth herein. Rather, these embodiments are provided so that the present disclosure will be thorough and complete, and the concepts of the example embodiments are fully conveyed to those skilled in the art.

Furthermore, the described features, structures, or characteristics may be combined in any suitable manner in one or more embodiments. In the following description, numerous specific details are provided for fully understanding the embodiments of the present disclosure. However, those skilled in the art will appreciate that the technical solution of the present disclosure may be practiced without one or more of specific details, or other methods, components, apparatuses, operations, etc. may be employed. In other cases, well-known methods, apparatuses, implementations, or operations are not shown or described in detail to avoid obscuring aspects of the present disclosure.

The block diagrams shown in the figures are merely functional entities and do not necessarily have to correspond to physically separate entities. That is, these functional entities may be implemented in software, or in one or more hardware modules or integrated circuits, or in different networks and/or processor apparatuses and/or microcontroller apparatuses.

The flowcharts shown in the figures are exemplary only and do not necessarily include all content and operations/steps, nor do they necessarily have to be performed in the order described. For example, some of the operations/steps may also be broken down and some of the operations/steps may be combined or partially combined so that the order of actual execution may vary depending on the actual situations.

Figure 1:
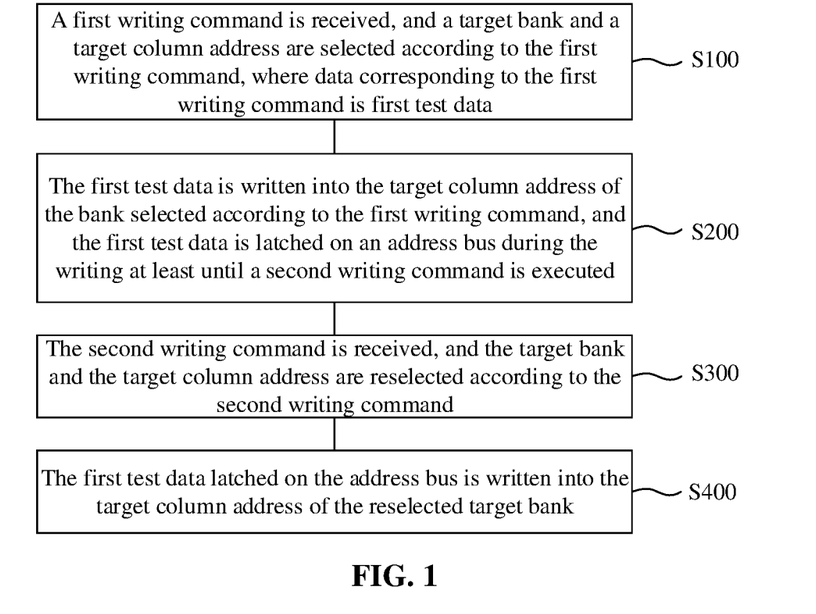
FIG. 1 is a flowchart of a data writing method for a memory array according to an embodiment of the present disclosure.

Embodiments of the present disclosure firstly provide a data writing method for a memory array. As shown in FIG. 1, the data writing method includes the following operations.

In operation S100, a first writing command is received, and a target bank and a target column address are selected according to the first writing command. Data corresponding to the first writing command is first test data.

In operation S200, the first test data is written into the target column address of the bank selected according to the first writing command, and the first test data is latched on an address bus during the writing at least until a second writing command is executed.

In operation S300, the second writing command is received, and the target bank and the target column address are reselected according to the second writing command.

In operation S400, the first test data latched on the address bus is written into a reselected target column address of a reselected target bank.

Figure 2:
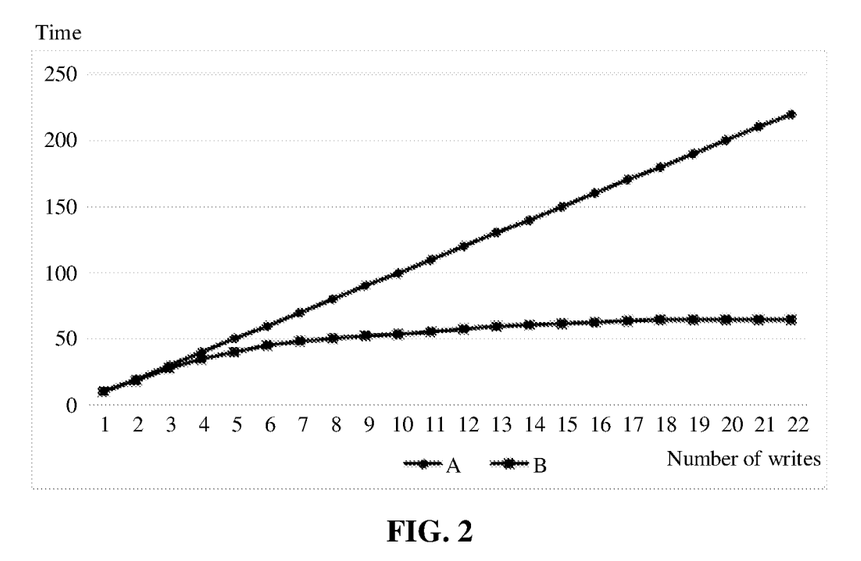
FIG. 2 is a schematic diagram of comparison of data writing time according to an embodiment of the present disclosure.

In the data writing method provided by the present disclosure, first test data is latched on an address bus (Dbus) during writing of a first writing command at least until a second writing command is executed. Next, after receiving the second writing command, the first test data latched on the address bus is written into a target column address of a target bank reselected according to the second writing command. The second writing command is a next command of the first writing command in succession. That is, when data is written in succession and a next beat of writing command comes, data of the previous beat of writing command latched on the address bus may be directly released so as to be directly written into a memory array, without needing to wait for the written data again (i.e. data corresponding to the second writing command). As shown in FIG. 2, line A is a corresponding relationship between the number of data writes in a conventional writing method (Normal write) and the required time. Line B is a corresponding relationship between the number of data writes in the data writing method (Test write) of the present disclosure and the required time. It can be seen that the data writing method of the present disclosure requires less time at the same number of data writes, whereby the data writing time can be shortened, and the data writing efficiency can be improved.

In an embodiment of the present disclosure, data corresponding to the second writing command is second test data, and the data writing method further includes the following operations. During writing of the first test data based on the second writing command, the second test data is latched on the address bus at least until a third writing command is executed. The third writing command is received, and the target bank and the target column address are reselected based on the third writing command. The second test data latched on the address bus is written into the target column address of the target bank reselected based on the third writing command.

The second test data is different from the first test data. During writing of the first test data based on the second writing command, the second test data is latched on the address bus at least until a third writing command is executed. After the third writing command is received, the second test data latched on the address bus is written into the target column address of the target bank reselected based on the third writing command. The third writing command is a next command of the second writing command in succession. That is, when different data from the first test data is written in succession, the second test data is latched on the address bus during the writing of the previous beat of writing command. When the next beat of writing command comes, the second test data latched on the address bus of the previous beat of writing command may be directly released so as to be directly written into the memory array, without needing to wait for the written data. Thus, the data writing time can be shortened, and the data writing efficiency can be improved.

It is to be noted that the first writing command, the second writing command, and the third writing command of the present disclosure are consecutive commands received sequentially, while the writing commands are not different, and the first writing command is not limited to the first one.

In an embodiment of the present disclosure, the data writing method further includes repeating operations S300 and S400. In operation S300, the second writing command is received, and the target bank and the target column address are reselected according to the second writing command. In operation S400, the first test data latched on the address bus is written into the reselected target column address of the reselected target bank. By repeating operation S300 and operation S400, the first test data can be written successively on the memory array according to the writing commands.

Operation S300 and operation S400 can be repeated until test data writing is completed in the memory array. While the first data is repeatedly written, the first test data corresponding to the first writing command is latched on the address bus until test data writing is completed in the memory array.

Specifically, when a writing operation is performed, data on DQ Pad is written after being converted from serial data to parallel data. Firstly, in a DQ Rx (data receiver), data is sampled by a DQS (source synchronous clock) signal, and data is written into a second-stage sampling latch as Even rise, Even fall, Odd rise, and Odd fall samples; and in the second-stage sampling latch, data is written into a data bus after being converted from serial data to parallel data. When the data in the data bus is always kept unchanged, the data may be kept in a state via a latch, and a test mode (Testmode) is introduced to control a latch signal so that the latched data is always kept unchanged. It is only necessary to keep the latch signal in the state of the previous beat until the next writing operation. The signal may be transmitted as the test is turned on, and turned off as the test is finished. In this case, the data corresponding to the first writing command is always latched. In another case, a Latch command is restarted as the writing command comes before the data comes. At this moment, the latch latches the latest test data to write directly when the next writing command comes.

Figure 3:
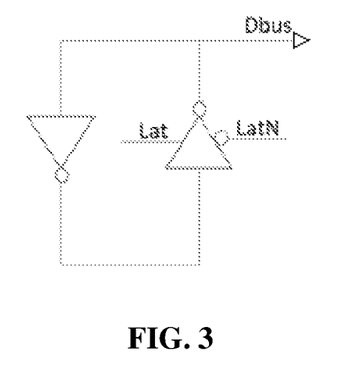
FIG. 3 is a schematic diagram of a control inverter according to an embodiment of the present disclosure.

The latch signal is an enable signal for enabling the latch, in particular enabling an inverter in the latch. There are two ways to control the inverter. In one way, after being processed, a latch signal is respectively used as a power signal and a low level signal connected to a ground terminal. As shown in FIG. 3, Lat is a latch signal, LatN represents an inverted signal, and a small circle corresponding to LatN represents that a low level is to be connected. In another way, the latch signal is used as a switch turning-on signal, namely, controlling the connection between a power terminal and a ground terminal and the inverter; and an MOS (metal-oxide semiconductor field effect) transistor is added between the inverter and the power terminal and the ground terminal, and the turning on of the MOS transistor is controlled via the latch signal, thereby enabling the inverter.

In an embodiment of the present disclosure, the data writing method further includes repeating operations S300 and S400. In operation S300, the second writing command is received, and the target bank and the target column address are reselected according to the second writing command. In operation S400, the first test data latched on the address bus is written into the reselected target column address of the reselected target bank. By repeating operation S300 and operation S400, the first test data can be written successively on the memory array according to the writing commands, and the first test data is written into a portion of the memory cells of the memory array. Next, when operation S300 and operation S400 are repeated for the last time, the second test data is latched on the address bus at least until a third writing command is executed; the third writing command is received, and the target bank and the target column address are reselected based on the third writing command; and the second test data latched on the address bus is written into the target column address of the target bank reselected based on the third writing command.

The second test data is different from the first test data. In the process of writing the first test data based on the last repeated second writing command, or after writing the first test data based on the last repeated second writing command again and before the data corresponding to the last second writing command comes, a refresh signal is interrupted and re-transmitted, so as to terminate the latching of the first test data and to latch the upcoming second test data. In this way, the second test data is latched on the address bus at least until a third writing command is executed. After the third writing command is received, the second test data latched on the address bus is written into the target column address of the target bank reselected based on the third writing command. The third writing command is a next command of the last repeated second writing command in succession. That is, after a preset number of identical first test data are written in succession, when second test data different from the first test data is written, the second test data is latched on the address bus during the writing of the previous beat of last repeated second writing command. When the next beat of third writing command comes, the second test data latched on the address bus of the previous beat of writing command may be directly released so as to be directly written into the memory array, without needing to wait for the written data. Thus, the data writing time can be shortened, and the data writing efficiency can be improved.

Further, the data writing method further includes repeating the following operations: the third writing command is received, and the target bank and the target column address are reselected according to the third writing command; and the second test data latched on the address bus is written into the reselected target column address of the reselected target bank.

The above operations can be repeated until test data writing is completed in the memory array. While the second data is repeatedly written, the second test data corresponding to the last repeated second writing command is latched on the address bus until test data writing is completed in the memory array. Definitely, test data may be written into a portion of the memory cells in the memory array by repeating the above operations.

Different third test data, or third test data and fourth test data, or more different test data may also be written into the memory array according to the above method of writing second test data, and the present disclosure is not limited thereto.

In an embodiment of the present disclosure, when the target bank and the target column address are reselected according to different writing commands, the target bank is reselected according to the current beat of writing command. If the reselected target bank and the target bank selected according to the previous beat of writing command are a same bank, a next address of the target column address selected according to the previous beat of writing command is taken as the target column address according to the current beat of writing command.

Exemplarily, the operation of reselecting the target bank and the target column address according to the second writing command includes the following operations. The target bank is reselected according to the second writing command. If the reselected target bank and the target bank selected according to the first writing command are the same bank, a next address of the target column address selected according to the first writing command is taken as the target column address according to the second writing command. For example, the target column address selected according to the first writing command is colA, and the target column address according to the second writing command is colA+1. Specifically, in Normal write, four clock signals (clk) are needed, the first two beats of the four clks are used to select a bank and a burst length, and the last two beats are used to select a column address. In the Test write, only two clks are needed to write test data into a memory array. The first two beats only need to select a bank and a burst length. If a reselected bank is not changed, for the selection of the column address, the previous column address will be incremented by 1 inside a circuit, thus writing data into the array.

In an embodiment of the present disclosure, when the target bank and the target column address are reselected according to different writing commands, the target bank is reselected according to the current writing command. If the reselected target bank and the target bank selected according to the previous beat of writing command are not a same bank, a preset column address of the reselected bank is taken as the target column address according to the second writing command. The preset column address may be the first column address of the reselected bank. Definitely, the preset column address may be a second column address, or a third column address, or other column addresses of the reselected bank, and the present disclosure is not limited thereto.

Exemplarily, the operation of reselecting the target bank and the target column address according to the second writing command includes the following operations. The target bank is reselected according to the second writing command. If the reselected target bank and the target bank selected according to the first writing command are not the same bank, the target column address according to the second writing command is determined as a preset column address of the reselected bank.

In an embodiment of the present disclosure, when the target bank and the target column address are reselected according to different writing commands, data writing operations are successively performed on a plurality of banks in a preset order. After all the memory cells in the target bank are written with test data, a next bank is selected for data writing until all the memory cells are written with test data, and then a next bank is selected. The process is repeated until the writing of data in the memory array is completed. When the next bank is selected for data writing, the reselected column address is the first column address of the bank.

In an embodiment of the present disclosure, when the target bank and the target column address are reselected according to different writing commands, and data writing operations are not performed successively on a plurality of banks in a preset order, a portion of the banks may be reselected as a target bank repeatedly. When a same bank is reselected as a target bank and the bank is not fully written, the reselected column address can be a next address of the target column address selected at the last data writing when the bank was previously selected as the target bank.

In an embodiment of the present disclosure, the operation of writing the first test data into the target column address of the target bank includes the following operations. A preset number of target word lines are enabled in the target bank, the first test data is written into memory cells connected to the target word lines by using a bit line corresponding to the target column address, and the target word lines are disabled after the writing is completed.

The preset number is equal to a burst length of a memory array to be measured multiplied by an amount of data in a single transmission (for example, if the burst length is 8 and the amount of data in a single transmission is 8, the preset number is equal to 64). Alternatively, the preset number is equal to the number of all memory cells corresponding to the target column address. At this moment, after the target word lines are disabled, a preset number of target word lines intersecting a bit line corresponding to a next column address of the target column address may be enabled to write test data to a successive preset number of memory cells.

Exemplarily, an X-Fast writing mode may be used to realize fast writing of test data in an X direction. That is, when the preset number is equal to the burst length of the memory array to be tested multiplied by the amount of data in a single transmission, a next word line of the target word line is enabled to write test data into a successive number (equal to the burst length multiplied by the amount of data in a single transmission) of memory cells connected to the next word line.

Exemplarily, a Y-Page writing mode may be used to realize whole-page writing in a Y direction. That is, when the preset number is equal to the number of all memory cells connected to a word line, after the target word line is disabled, a next word line of the target word line is enabled to write test data into a successive preset number of memory cells connected to the next word line.

Specifically, a Y-Fast writing mode may be used to realize fast writing in the Y direction, and the preset number is equal to the burst length of the memory array to be tested multiplied by the amount of data in a single transmission. That is, after receiving a writing command, a bank and a target column address are selected, a preset number of target word lines are enabled, and test data is written into memory cells connected to the target word lines by using a bit line corresponding to the target column address. Generally, the memory cells defined by the enabled target word lines and the target column address are memory cells where a writing operation is not yet performed. When the same target column address is selected, test data may be continuously written into the remaining memory cells corresponding to the target column address where the writing operation is not yet performed, and by repeating the above operations, all the memory cells in the bank are fully written with the test data.

Embodiments of the present disclosure also provide a test method for a memory array. The test method includes the following operations.

In operation S910, test data is written into a memory array by the above data writing method.

In operation S920, the test data written into the memory array is read.

In operation S930, it is determined whether read test data is consistent with written test data.

In operation S941, if the read test data is not consistent with the written test data, it is determined that a memory cell in the memory array is defective.

In the test method for the memory array provided by the present disclosure, when data is written in succession and the next beat of writing command comes, data latched on an address bus of the previous beat of writing command may be directly released so as to be directly written into the memory array, without needing to wait for the written data again. Thus, the data writing time can be shortened, and the test efficiency can be improved.

In an embodiment of the present disclosure, the test method may further include the following operations.

In operation S942, if the read test data is consistent with the written test data, it is determined that a memory cell in the memory array is not defective.

The following describes apparatus embodiments of the present disclosure that may be used to perform the data writing method for a memory array described above in the present disclosure.

Figure 4:
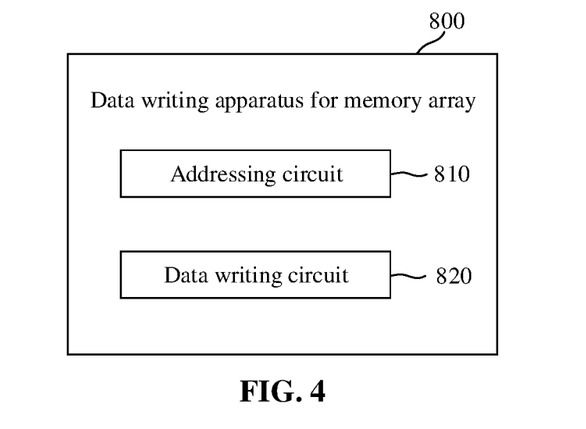
FIG. 4 is a schematic diagram of a data writing apparatus for a memory array according to an embodiment of the present disclosure.

Embodiments of the present disclosure also provide a data writing apparatus for a memory array. As shown in FIG. 4, the data writing apparatus 800 includes an addressing circuit 810 and a data writing circuit 820.

The addressing circuit 810 is configured to receive a first writing command, and select a target bank and a target column address according to the first writing command. Data corresponding to the first writing command is first test data.

The data writing circuit 820 is configured to write the first test data into the target column address of the bank selected according to the first writing command, and latch the first test data on an address bus during the writing at least until a second writing command is executed.

The addressing circuit 810 is further configured to receive the second writing command, and reselect the target bank and the target column address according to the second writing command. The data writing circuit 820 is further configured to write the first test data latched on the address bus into a reselected target column address of a reselected target bank.

In the data writing apparatus provided by the present disclosure, the data writing circuit latches first test data on an address bus during writing of a first writing command at least until a second writing command is executed. Next, the data writing circuit receives the second writing command, and writes the first test data latched on the address bus into a target column address of a target bank reselected according to the second writing command. The second writing command is a next command of the first writing command in succession. That is, when the data writing circuit writes data in succession and a next beat of writing command comes, data of the previous beat of writing command latched on the address bus may be directly released so as to be directly written into a memory array, without needing to wait for the written data again, whereby the data writing time can be shortened, and the data writing efficiency can be improved.

Since the various functional modules of the data writing apparatus for the memory array according to the example embodiments of the present disclosure correspond to the operations of the above example embodiments of the data writing method for a memory array, the details which are not disclosed in the apparatus embodiments of the present disclosure may be referred to the above embodiments of the data writing method for a memory array according to the present disclosure.

Figure 5:
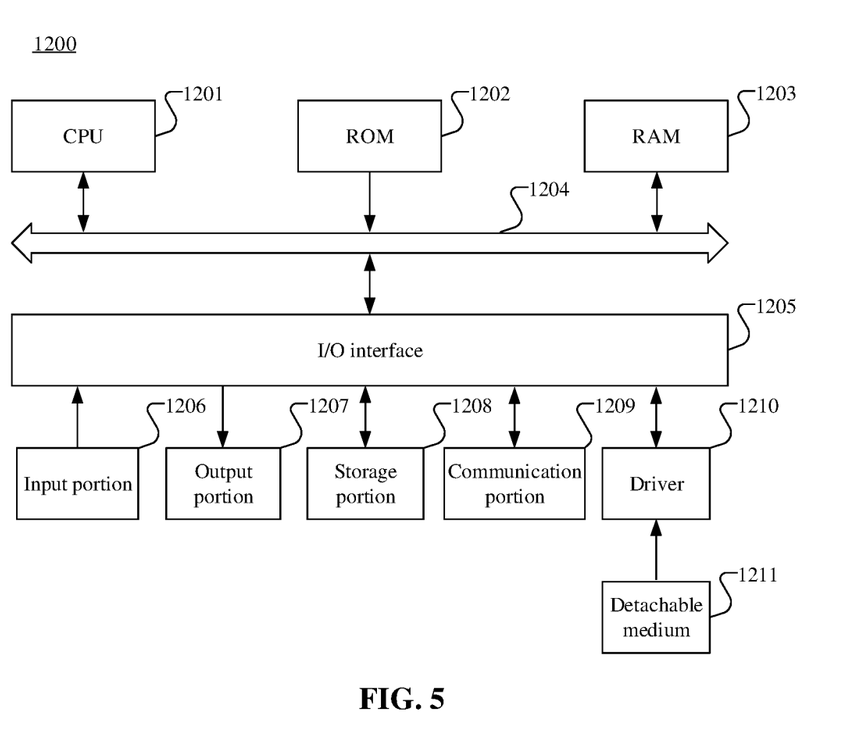
FIG. 5 illustrates a schematic structural diagram of a computer system suitable for implementing an electronic device according to an embodiment of the present disclosure.

Reference is now made to FIG. 5, which illustrates a schematic structural diagram of a computer system 1200 suitable for implementing an electronic device according to an embodiment of the present disclosure. The computer system 1200 for the electronic device shown in FIG. 5 is merely an example, and should not impose any limitation on the function and scope of use of the embodiments of the present disclosure.

As shown in FIG. 5, the computer system 1200 includes a Central Processing Unit (CPU) 1201, which may be loaded into a Random Access Memory (RAM) 1203 according to a program stored in a Read-Only Memory (ROM) 1202 or from a storage portion 1208 to perform various appropriate actions and processes. In the RAM 1203, various programs and data required for the system operation are also stored. The CPU 1201, the ROM 1202, and the RAM 1203 are connected to each other through a bus 1204. An Input/output (I/O) interface 1205 is also connected to the bus 1204.

The following components are connected to the I/O interface 1205: an input portion 1206 including a keyboard, a mouse, and the like; an output portion 1207 including a Cathode-Ray Tube (CRT), a Liquid Crystal Display (LCD), a speaker, and the like; a storage portion 1208 including a hard disk; and a communication portion 1209 including a network interface card such as a Local Area Network (LAN) card or a modem. The communication portion 1209 performs communication processing via a network such as the Internet. A driver 1210 is also connected to the I/O interface 1205 as needed. A detachable medium 1211, such as a magnetic disk, an optical disk, a magneto-optical disk, and a semiconductor memory, is installed on the driver 1210 as needed, whereby a computer program read therefrom is installed into the storage portion 1208 as needed.

In particular, according to an embodiment of the present disclosure, the process described above with reference to the flowchart may be implemented as a computer software program. For example, an embodiment of the present disclosure includes a computer program product including a computer program carried on a computer-readable medium, the computer program containing a program code for performing the method shown in the flowchart. In such an embodiment, the computer program may be downloaded and installed from the network through the communication portion 1209, and/or installed from the detachable medium 1211. When the computer program is executed by the CPU 1201, the above functions defined in the method of the present application are executed.

It is to be noted that the computer-readable medium shown in the present disclosure may be a computer-readable signal medium or a computer-readable storage medium or any combination of the foregoing. The computer-readable storage medium may be, for example, but not limited to, an electronic, magnetic, optical, electromagnetic, infrared, or semiconductor system, apparatus, or device, or any combination thereof. A more specific example of the computer-readable storage medium may include, but is not limited to: an electric connection portion with one or more wires, a portable computer disk, a hard disk, a RAM, a ROM, an Erasable Programmable ROM (EPROM) (or flash memory), an optical fiber, a portable CD-ROM, an optical storage device, a magnetic storage device, or any suitable combination of the foregoing. In the present disclosure, the computer-readable storage medium may be any tangible medium that contains or stores a program. The program may be used by or in combination with an instruction execution system, apparatus, or device. In the present disclosure, the computer-readable signal medium may include a data signal that is propagated in a baseband or as part of a carrier, carrying computer-readable program codes. Such propagated data signals may take a variety of forms including, but not limited to, electromagnetic signals, optical signals, or any suitable combination of the foregoing. The computer-readable signal medium may also be any computer-readable medium other than a computer-readable storage medium, and the computer-readable medium may send, propagate, or transmit a program for use by or in connection with an instruction execution system, apparatus, or device. Program codes included in the computer-readable medium may be transmitted by any suitable medium, including but not limited to wireless, wired, optical cable, RF, etc., or any suitable combination of the foregoing.

The flowchart and block diagram in the accompanying drawings illustrate the architecture, functionality, and operation of possible implementations of systems, methods and computer program products according to various embodiments of the present disclosure. In this regard, each block in the flowchart or block diagram may represent a module, a program segment, or a part of code, which contains one or more executable instructions for implementing a specified logical function. It is also to be noted that in some alternative implementations, the functions noted in the blocks may also occur in a different order than those marked in the drawings. For example, two successively represented blocks may actually be executed substantially in parallel, and they may sometimes be executed in the reverse order, depending on the functions involved. It is further to be noted that each block in the block diagrams or the flowcharts and a combination of the blocks in the block diagrams or the flowcharts may be implemented by a dedicated hardware-based system configured to execute a specified function or operation or may be implemented by a combination of a special hardware and a computer instruction.

The units involved in the embodiments of the present disclosure may be implemented by software or hardware. The described units may also be disposed in a processor. The names of the units do not, in some cases, define the units themselves.

As another aspect, the present application also provides a computer-readable medium, which may be included in the electronic device described in the above embodiments, or may exist alone without being assembled into the electronic device. The computer-readable medium carries one or more programs which, when executed by the electronic device, enable the electronic device to implement the data writing method for a memory array as described in the above embodiments.

For example, the electronic device may implement as shown in FIG. 1. In operation S100, a first voltage is written into a memory cell connected to a target word line, and a second voltage is written into a memory cell connected to at least one other adjacent word line. Alternatively, a second voltage is written into a memory cell connected to a target word line, and a first voltage is written into a memory cell connected to at least one other adjacent word line. The first voltage is greater than the second voltage. In operation S200, the first voltage or the second voltage is repeatedly written into other word lines. In operation S300, the memory cell connected to the target word line is read, and it is determined whether the reading result of each memory cell is equal to the first voltage or the second voltage written therein. In operation S400, if the reading result of the memory cell is not equal to the written first voltage or second voltage, it is determined that the memory cell is in electric leakage.

It is to be noted that although several modules or units of the device for action execution are mentioned in the above detailed description, such division is not mandatory. In fact, according to the embodiments of the present disclosure, the features and functions of two or more modules or units described above may be embodied in one module or unit. Conversely, the features and functions of one module or unit described above may be further divided into multiple modules or units and embodied.

Through the description of the above embodiment, those skilled in the art will readily understand that the example embodiments described herein may be implemented by software or by software in combination with necessary hardware. Therefore, the technical solution according to the embodiment of the present disclosure may be embodied in the form of a software product, which may be stored in a non-volatile storage medium (which may be a CD-ROM, a USB flash drive, a mobile hard disk, etc.) or on a network. A number of instructions are included to cause a computing device (which may be a personal computer, a server, a touch terminal, or a network device, etc.) to perform a method according to an embodiment of the present disclosure.

Other embodiments of the present disclosure will be apparent to those skilled in the art after considering the specification and practicing the present disclosure herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are to be regarded as illustrative only, and the true scope and spirit of the present disclosure are pointed out by the claims.

It is to be understood that the present disclosure is not limited to the accurate structure that have been described and shown in the drawings, and may make various modifications and variations without departing the scope thereof. The scope of the present disclosure is limited only by the appended claims.

The invention claimed is:

1. A data writing method for a memory array, comprising:
receiving a first writing command, and selecting a target bank and a target column address according to the first writing command, data corresponding to the first writing command being first test data;
writing the first test data into the target column address of the target bank selected according to the first writing command, and latching the first test data on an address bus during the writing at least until a second writing command is executed;
receiving the second writing command, and reselecting the target bank and the target column address according to the second writing command; and
writing the first test data latched on the address bus into a reselected target column address of a reselected target bank.

2. The data writing method of claim 1, wherein data corresponding to the second writing command is second test data, and the method further comprises:
during writing of the first test data based on the second writing command, latching the second test data on the address bus at least until a third writing command is executed;
receiving the third writing command, and reselecting the target bank and the target column address based on the third writing command; and
writing the second test data latched on the address bus into the target column address of the target bank reselected based on the third writing command.

3. The data writing method of claim 1, further comprising:
repeating the following operations until test data writing is completed in the memory array: receiving the second writing command, reselecting the target bank and the target column address according to the second writing command, and writing the first test data latched on the address bus into the reselected target column address of the reselected target bank.

4. The data writing method of claim 3, wherein the first test data corresponding to the first writing command is latched on the address bus until test data writing is completed in the memory array.

5. The data writing method of claim 1, wherein the reselecting the target bank and the target column address according to the second writing command comprises:
reselecting the target bank according to the second writing command; and
when the reselected target bank and the target bank selected according to the first writing command are a same bank, taking a next address of the target column address selected according to the first writing command as the target column address according to the second writing command.

6. The data writing method of claim 1, wherein the reselecting the target bank and the target column address according to the second writing command comprises:
reselecting the target bank according to the second writing command; and
when the reselected target bank and the target bank selected according to the first writing command are not a same bank, taking a preset column address of the reselected target bank as the target column address according to the second writing command.

7. The data writing method of claim 6, wherein the preset column address is a first column address of the reselected target bank.

8. The data writing method of claim 1, wherein the writing the first test data into the target column address of the target bank comprises:
enabling a preset number of target word lines in the target bank, writing the first test data into memory cells connected to the target word lines by using a bit line corresponding to the target column address, and disabling the target word lines after the writing is completed.

9. The data writing method of claim 8, wherein the preset number is equal to a burst length of the memory array multiplied by an amount of data in a single transmission.

10. A test method for a memory array, comprising:
writing test data into a memory array by the data writing method of claim 1;
reading the test data written into the memory array;
determining whether read test data is consistent with written test data; and
when the read test data is not consistent with the written test data, determining that a memory cell in the memory array is defective.

11. A non-transitory computer-readable medium having stored thereon computer-executable instructions that, when executed by a processor, cause the processor to implement the data writing method for a memory array of claim 1.

12. A data writing apparatus for a memory array, comprising:
an addressing circuit configured to receive a first writing command, and select a target bank and a target column address according to the first writing command, data corresponding to the first writing command being first test data; and
a data writing circuit configured to write the first test data into the target column address of the target bank selected according to the first writing command, and latch the first test data on an address bus during the writing at least until a second writing command is executed,
wherein the addressing circuit is further configured to receive the second writing command, and reselect the target bank and the target column address according to the second writing command, and the data writing circuit is further configured to write the first test data latched on the address bus into a reselected target column address of a reselected target bank.

13. An electronic device, comprising:
one or more processors; and
a memory configured to store computer-executable instructions that, when executed by the one or more processors, cause the one or more processors to implement operations of:
receiving a first writing command, and selecting a target bank and a target column address according to the first writing command, data corresponding to the first writing command being first test data;
writing the first test data into the target column address of the target bank selected according to the first writing command, and latching the first test data on an address bus during the writing at least until a second writing command is executed;
receiving the second writing command, and reselecting the target bank and the target column address according to the second writing command; and
writing the first test data latched on the address bus into a reselected target column address of a reselected target bank.

14. The electronic device of claim 13, wherein data corresponding to the second writing command is second test data, and the operations further comprise:
during writing of the first test data based on the second writing command, latching the second test data on the address bus at least until a third writing command is executed;
receiving the third writing command, and reselecting the target bank and the target column address based on the third writing command; and
writing the second test data latched on the address bus into the target column address of the target bank reselected based on the third writing command.

15. The electronic device of claim 13, wherein the one or more processor are caused to further implement an operation of:
repeating the following operations until test data writing is completed in a memory array: receiving the second writing command, reselecting the target bank and the target column address according to the second writing command, and writing the first test data latched on the address bus into the reselected target column address of the reselected target bank.

16. The electronic device of claim 15, wherein the first test data corresponding to the first writing command is latched on the address bus until test data writing is completed in the memory array.

17. The electronic device of claim 13, wherein the reselecting the target bank and the target column address according to the second writing command comprises:
reselecting the target bank according to the second writing command; and
when the reselected target bank and the target bank selected according to the first writing command are a same bank, taking a next address of the target column address selected according to the first writing command as the target column address according to the second writing command.

18. The electronic device of claim 13, wherein the reselecting the target bank and the target column address according to the second writing command comprises:
reselecting the target bank according to the second writing command; and
when the reselected target bank and the target bank selected according to the first writing command are not a same bank, taking a preset column address of the reselected target bank as the target column address according to the second writing command.

19. The electronic device of claim 18, wherein the preset column address is a first column address of the reselected target bank.

20. The electronic device of claim 13, wherein the writing the first test data into the target column address of the target bank comprises:
enabling a preset number of target word lines in the target bank, writing the first test data into memory cells connected to the target word lines by using a bit line corresponding to the target column address, and disabling the target word lines after the writing is completed.

* * * * *